(12) United States Patent
Imai

(10) Patent No.: US 8,395,949 B2
(45) Date of Patent: Mar. 12, 2013

(54) SEMICONDUCTOR INTEGRATED CIRCUIT AND METHOD FOR CONTROLLING THE SAME

(75) Inventor: Seiro Imai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 495 days.

(21) Appl. No.: 12/648,851

(22) Filed: Dec. 29, 2009

(65) Prior Publication Data

US 2010/0195422 A1 Aug. 5, 2010

(30) Foreign Application Priority Data

Feb. 3, 2009 (JP) .................................. 2009-22380

(51) Int. Cl.
*G11C 7/00* (2006.01)
(52) U.S. Cl. ..................... 365/194; 365/210; 365/203
(58) Field of Classification Search .................. 365/194, 365/207, 210, 203, 185.25, 185.21, 230.06, 365/230.08, 191
See application file for complete search history.

(56) References Cited

U.S. PATENT DOCUMENTS

| | | | |
|---|---|---|---|
| 6,373,745 B2 * | 4/2002 | Saito et al. ..................... 365/174 |
| 7,184,296 B2 | 2/2007 | Hatakeyama et al. | |
| 7,369,433 B2 | 5/2008 | Toda | |
| 7,453,749 B2 | 11/2008 | Suzuki et al. | |
| 7,522,462 B2 | 4/2009 | Edahiro et al. | |
| 8,089,794 B1 * | 1/2012 | Deshpande et al. ....... 365/49.17 |
| 2010/0090725 A1 | 4/2010 | Imai et al. | |

FOREIGN PATENT DOCUMENTS

| | | |
|---|---|---|
| JP | 06-338192 | 12/1994 |
| JP | 2007035124 | 2/2007 |

OTHER PUBLICATIONS

Japanese Office Action for Japanese Application No. 2009-022380 mailed on Dec. 18, 2012.

* cited by examiner

*Primary Examiner* — Dang Nguyen
(74) *Attorney, Agent, or Firm* — Turocy & Watson, LLP

(57) ABSTRACT

A semiconductor integrated circuit includes: a current difference sense type of a sense amplifier including: an input line connected to memory cells as a target to be read, a reference line connected to reference cells, and a first pre-charge circuit configured to pre-charge the input line and the reference line; a second pre-charge circuit configured to perform pre-charging of the input line and pre-charging of the reference line; and a control circuit configured to control the second pre-charge circuit so that the second pre-charge circuit may perform both the pre-charging of the input line and the pre-charging of the reference line independently of each other, and start both the pre-charging of the input line and the pre-charging of the reference line earlier than pre-charging by the first pre-charge circuit.

19 Claims, 16 Drawing Sheets

FIRST EMBODIMENT

FIRST EMBODIMENT

FIRST EMBODIMENT

FIRST EMBODIMENT

FIG. 15  SECOND EMBODIMENT

US 8,395,949 B2

SEMICONDUCTOR INTEGRATED CIRCUIT AND METHOD FOR CONTROLLING THE SAME

CROSS REFERENCE TO RELATED APPLICATIONS

This application is based upon and claims the benefit of priority from the prior Japanese Patent Application No. 2009-22380, filed on Feb. 3, 2009 in Japan, the entire contents of which are incorporated herein by reference.

BACKGROUND OF THE INVENTION

1. Field of the Invention

The present invention relates to a semiconductor integrated circuit and a method for controlling the semiconductor integrated circuit.

2. Related Art

Recently, semiconductor memories have come to operate on lower voltages and at higher speeds increasingly. This has led to a desire that a sense amplifier and a pre-charge circuit which are used to read signals from the semiconductor memory may also operate faster on a lower voltage.

As a current difference sense type of a sense amplifier operating on a lower voltage, a circuit equipped with a differential amplifier and a current source for the differential amplifier is used. The sense amplifier has its input line connected to a bit line for memory cells and its reference line connected to a reference bit line for reference cells. This type of the sense amplifier is arranged to pre-charge the input line and the reference line by using the current source and then sense a differential current between the memory cell and the reference cell by using the differential amplifier.

This sense amplifier may be unstable in sensing if an excessive current flows through the differential amplifier. Accordingly, to secure the stability in sensing, it is necessary to limit current driving capability by setting a longer channel length L of a MOS transistor that operates as the current source. However, the MOS transistor is used also in pre-charging, thus leading to a problem in that a smaller applicable current may prolong a pre-charge time.

It is to be noted that as the sense amplifier, such a circuit is known as to be described in, for example, Japanese Patent Application Laid-Open No. 2007-35124.

SUMMARY OF THE INVENTION

In accordance with one embodiment of the present invention, there is provided a semiconductor integrated circuit includes: a current difference sense type of a sense amplifier including: an input line connected to memory cells as a target to be read, a reference line connected to reference cells, and a first pre-charge circuit configured to pre-charge the input line and the reference line; a second pre-charge circuit configured to perform pre-charging of the input line and pre-charging of the reference line; and a control circuit configured to control the second pre-charge circuit so that the second pre-charge circuit may perform both the pre-charging of the input line and the pre-charging of the reference line independently of each other, and start both the pre-charging of the input line and the pre-charging of the reference line earlier than pre-charging by the first pre-charge circuit.

Moreover, in accordance with another embodiment of the present invention, there is provided a method for controlling a semiconductor integrated circuit including: a differential current sense amplifier including: an input line connected to memory cells as a target to be read, a reference line connected to reference cells, and a first pre-charge circuit configured to pre-charge the input line and the reference line; and a second pre-charge circuit configured to perform pre-charging of the input line and pre-charging of the reference line, the method comprising: performing both the pre-charging of the input line and the pre-charging of the reference line, by the second pre-charge circuit, independently of each other; and starting both the pre-charging of the input line and the pre-charging of the reference line, by the second pre-charge circuit, earlier than pre-charging by the first pre-charge circuit.

DETAILED DESCRIPTION OF THE INVENTION

Hereafter, embodiments of the present invention will be described with reference to the drawings. Those embodiments will not limit the present invention.

Before describing the embodiments of the present invention, a current difference sense type of a sense amplifier (hereinafter abbreviated as sense amplifier) of a comparison example that the present inventor knows will be described.

Figure 1:
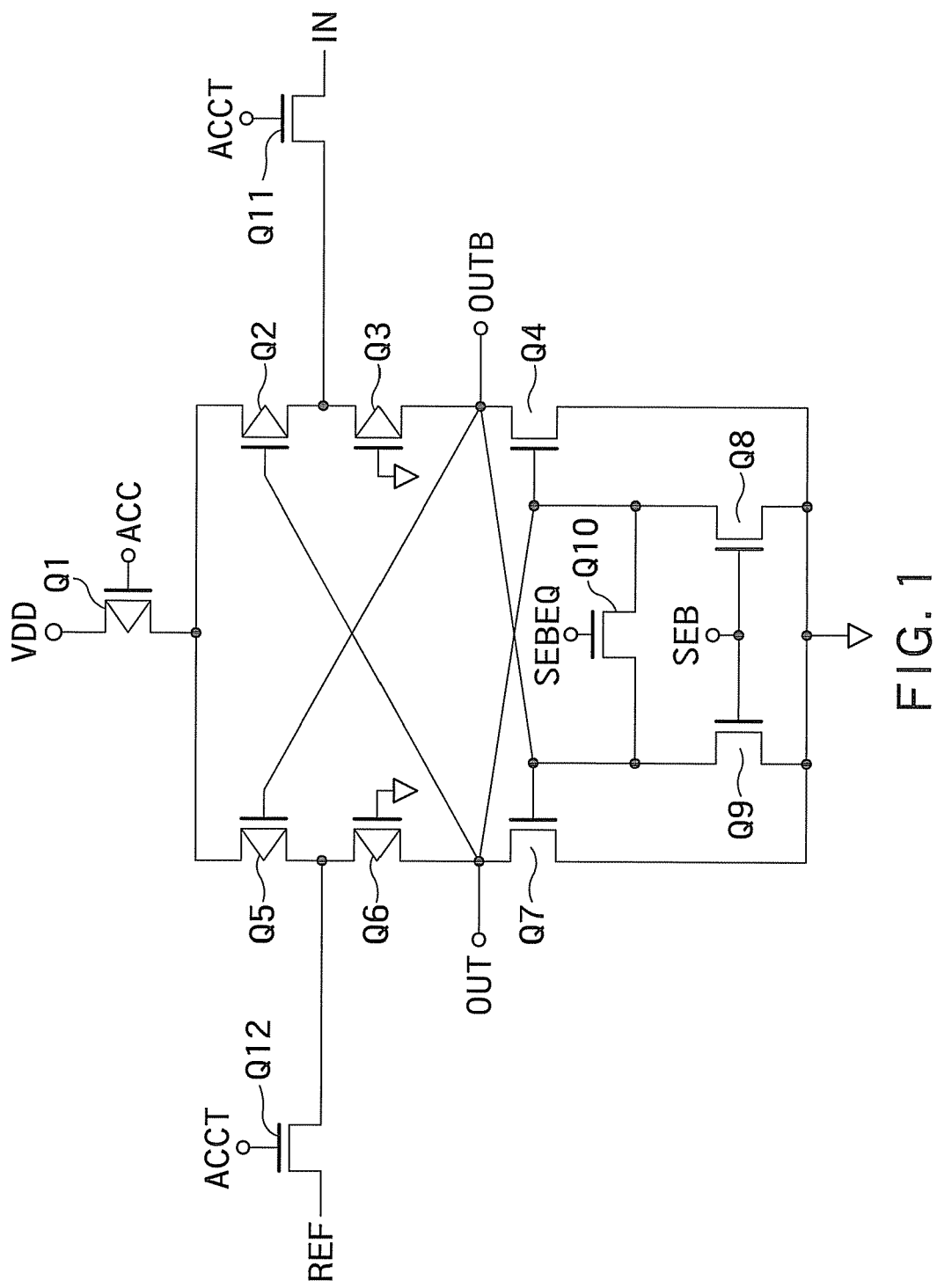
FIG. 1 is a circuit diagram of a sense amplifier of a comparison example operating on a lower voltage.

FIG. 1 is a circuit diagram of the sense amplifier of the comparison example operating on a lower voltage. The sense amplifier of FIG. 1 includes a PMOS transistor Q1 (first MOS transistor: first pre-charge circuit) which constitutes a current source, PMOS transistors Q2 and Q3 and an NMOS transistor Q4 which are connected in series between a drain of the transistor Q1 and a ground terminal, PMOS transistors Q5 and Q6 and an NMOS transistor Q7 which are similarly connected in series between the drain of the transistor Q1 and the ground terminal, an NMOS transistor Q8 connected between a gate of the NMOS transistor Q4 and the ground terminal, an NMOS transistor Q9 connected between a gate of the NMOS transistor Q7 and the ground terminal, an NMOS transistor Q10 connected between a drain of the transistor Q8 and a drain of the transistor Q9, an NMOS transistor Q11 connected between a drain of the transistor Q2 and an input line IN, and an NMOS transistor Q12 connected between a drain of the transistor Q5 and a reference line REF. The transistors Q2 to Q7 constitute a differential amplifier.

From a connection node between a drain of the transistor Q6 and a drain of the transistor Q7, an output signal OUT is provided, and from a connection node between a drain of the transistor Q3 and a drain of the transistor Q4, an output signal OUTB is provided. The output signal OUT is supplied to the gates of the transistors Q2 and Q4 and the drain of the transistor Q8. The output signal OUTB is supplied to the gates of the transistors Q5 and Q7 and the drain of the transistor Q9.

Gates of the transistors Q3 and Q6 are connected to the ground terminal. Gates of the transistors Q11 and Q12 are each supplied with an ACCT signal.

The input line IN is connected to bit lines (not shown) of memory cells. The reference line REF is connected to a reference bit line (not shown) of reference cells.

Gates of the transistors Q8 and Q9 are each supplied with a SEB signal. A gate of the transistor Q10 is supplied with a SEBEQ signal (Equalize signal).

Figure 2:
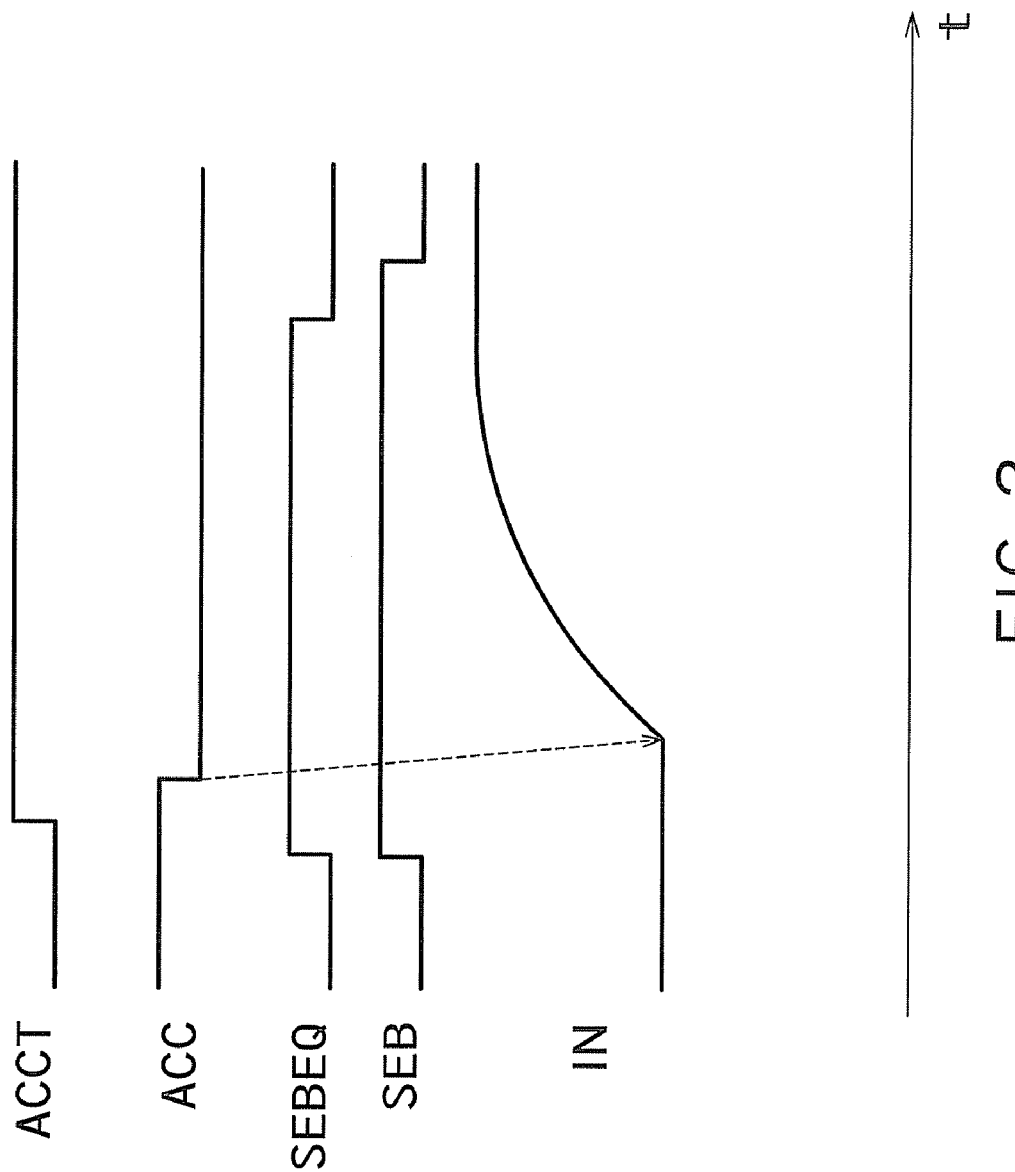
FIG. 2 is a timing chart showing pre-charge operations of the sense amplifier of FIG. 1.

FIG. 2 is a timing chart showing pre-charge operations of the sense amplifier of FIG. 1. First, the SEBEQ and SEB signals go to a higher level. Subsequently, the ACCT signal goes to the higher level, to turn on the transistors Q11 and Q12. This causes input terminals of the differential amplifier of the sense amplifier to be electrically connected to the input line IN and the reference line REF respectively. Next, an ACC signal goes to a lower level. This causes the input line IN and the reference line REF (that is, the bit lines and the reference bit lines) to be pre-charged through a power supply VDD and the transistor Q1 in this order. At this point in time, the SEBEQ signal is at the higher level, so that voltage levels of the output signals OUT and OUTB are equalized to each other through the transistor Q10. This operation is referred to equalization.

After the pre-charging ends, if the SEBEQ signal shifts from the higher level to the lower level and, subsequently, the SEB signal shifts from the higher level to the lower level, the sense amplifier of FIG. 1 performs sensing. The sense amplifier of FIG. 1 senses a current while the SEB signal is at the higher voltage level, and a voltage when the SEB signal goes to the lower voltage level. In such a manner, it senses a current difference between the input line IN and the reference line REF (current difference between the memory cell and the reference cell).

(First Embodiment)

A description will be given of the first embodiment with reference to FIGS. 3 to 13. One of the features of the present embodiment is that a new pre-charge path has been added to a pre-charge path coming out of a sense amplifier body.

Figure 3:
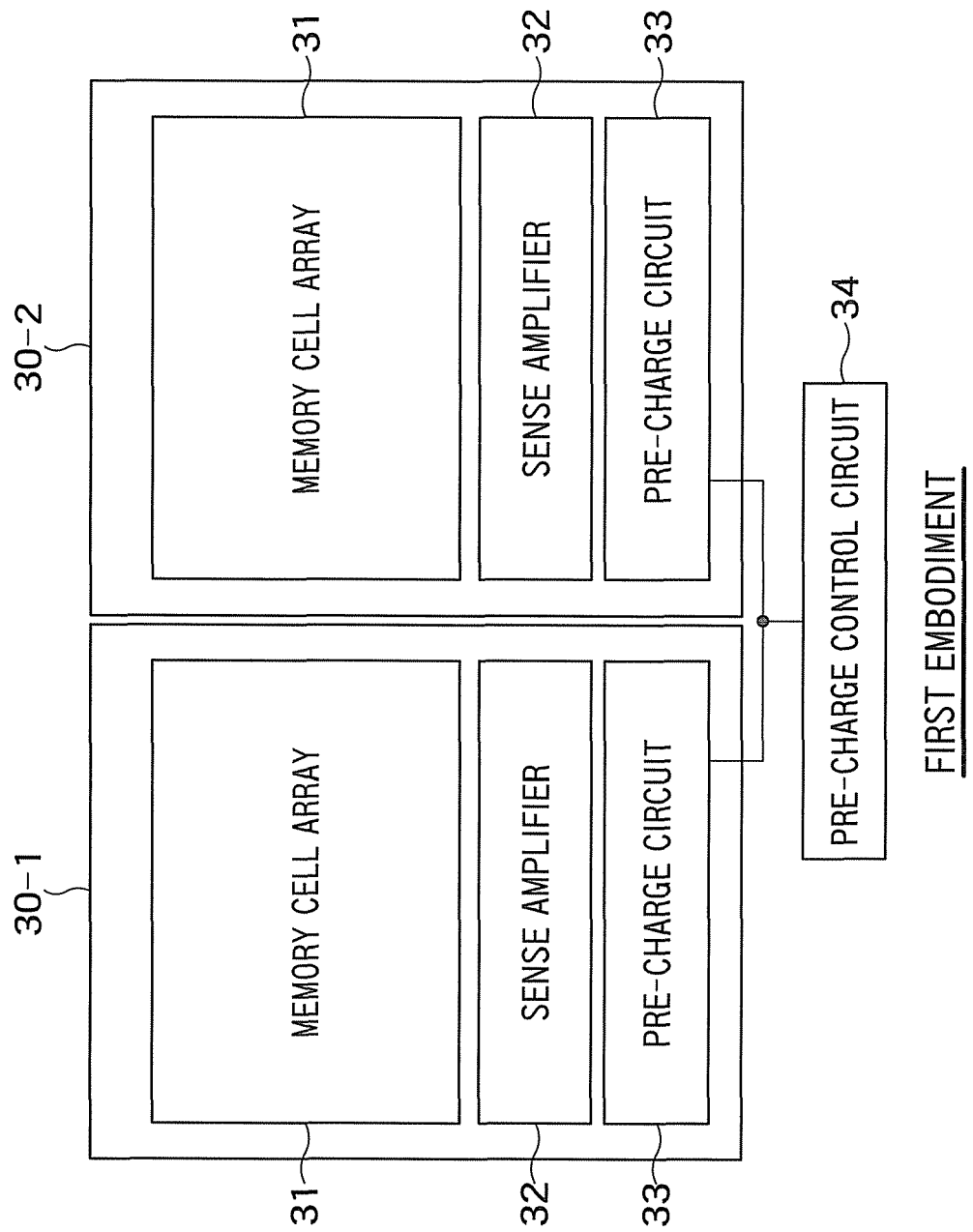
FIG. 3 is a block diagram showing an overall constitution of a semiconductor integrated circuit according to a first embodiment of the present invention.

FIG. 3 is a block diagram showing the overall constitution of a semiconductor integrated circuit according to the present embodiment. As shown in the figure, the semiconductor integrated circuit includes blocks 30-1 and 30-2. Although the semiconductor integrated circuit has the plurality of blocks, only two of them are shown here as one example. Blocks 30-1 and 30-2 each have a memory cell array 31, a sense amplifier 32 whose input line is connected to a bit line for memory cells and whose reference line is connected to a reference bit line for reference cells in the memory cell array 31, and a pre-charge circuit 33 (second pre-charge circuit) that pre-charges the input line and the reference line. The sense amplifier 32 is, for example, the circuit of FIG. 1. A pre-charge control circuit 34 (control circuit) controls the pre-charge circuit 33 so that the pre-charge circuit 33 may perform both the pre-charging of the input line and the pre-charging of the reference line independently of each other, and start both the pre-charging of the input line and the pre-charging of the reference line earlier than the pre-charging by a transistor Q1 in FIG. 1. The pre-charging and the sensing are performed in the activated block of the blocks 30-1 and 30-2.

Next, a description will be given of a specific circuit constitution.

Figure 4:
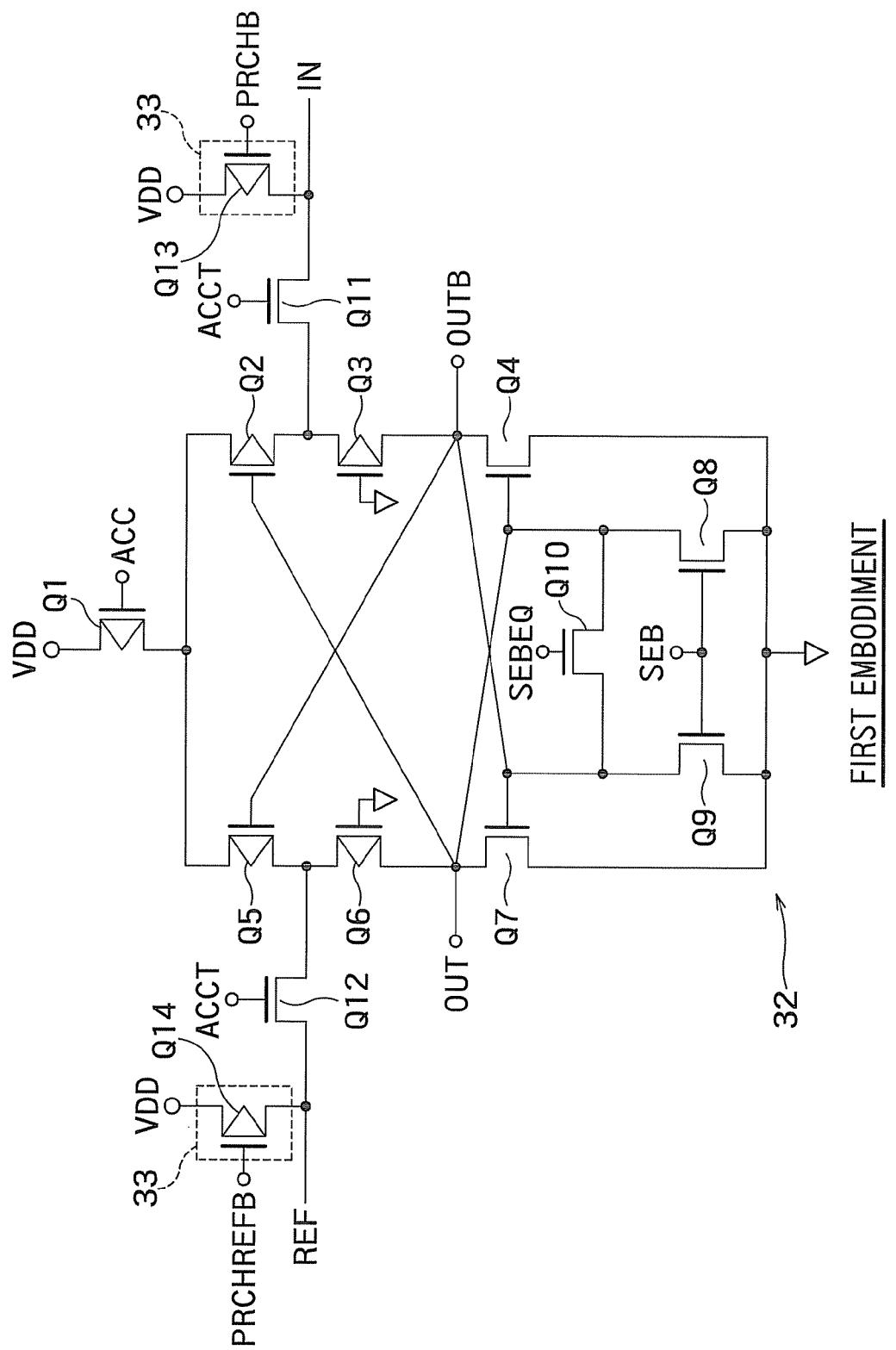
FIG. 4 is a circuit diagram of the sense amplifier and a pre-charge circuit according to the first embodiment of the present invention.

FIG. 4 is a circuit diagram of the sense amplifier 32 and the pre-charge circuit 33. As shown in the figure, a PMOS transistor Q13 (second MOS transistor: pre-charge circuit 33) has its two terminals connected to a power supply VDD and an input line IN respectively. A PMOS transistor Q14 (third MOS transistor: pre-charge circuit 33) has its two terminals connected to the power supply VDD and a reference line REF respectively. A gate of the transistor Q13 is supplied with a PRCHB signal (pre-charge control signal), and a gate of the transistor Q14 is supplied with a PRCHREFB signal (pre-charge control signal). The PRCHB and PRCHREFB signals determine operation timings of the transistors Q13 and Q14.

Since the sense amplifier 32 has the same circuit constitution as the sense amplifier in FIG. 1, identical reference numerals are given to similar components in them, and repetitive description on the identical components will be omitted.

Further, the pre-charge control circuit 34 of FIG. 3 includes a GLDRSTLAT signal generation circuit of FIG. 5, a PRCHB signal generation circuit of FIG. 6, and a PRCHREFB signal generation circuit of FIG. 7, which are described below.

Figure 5:
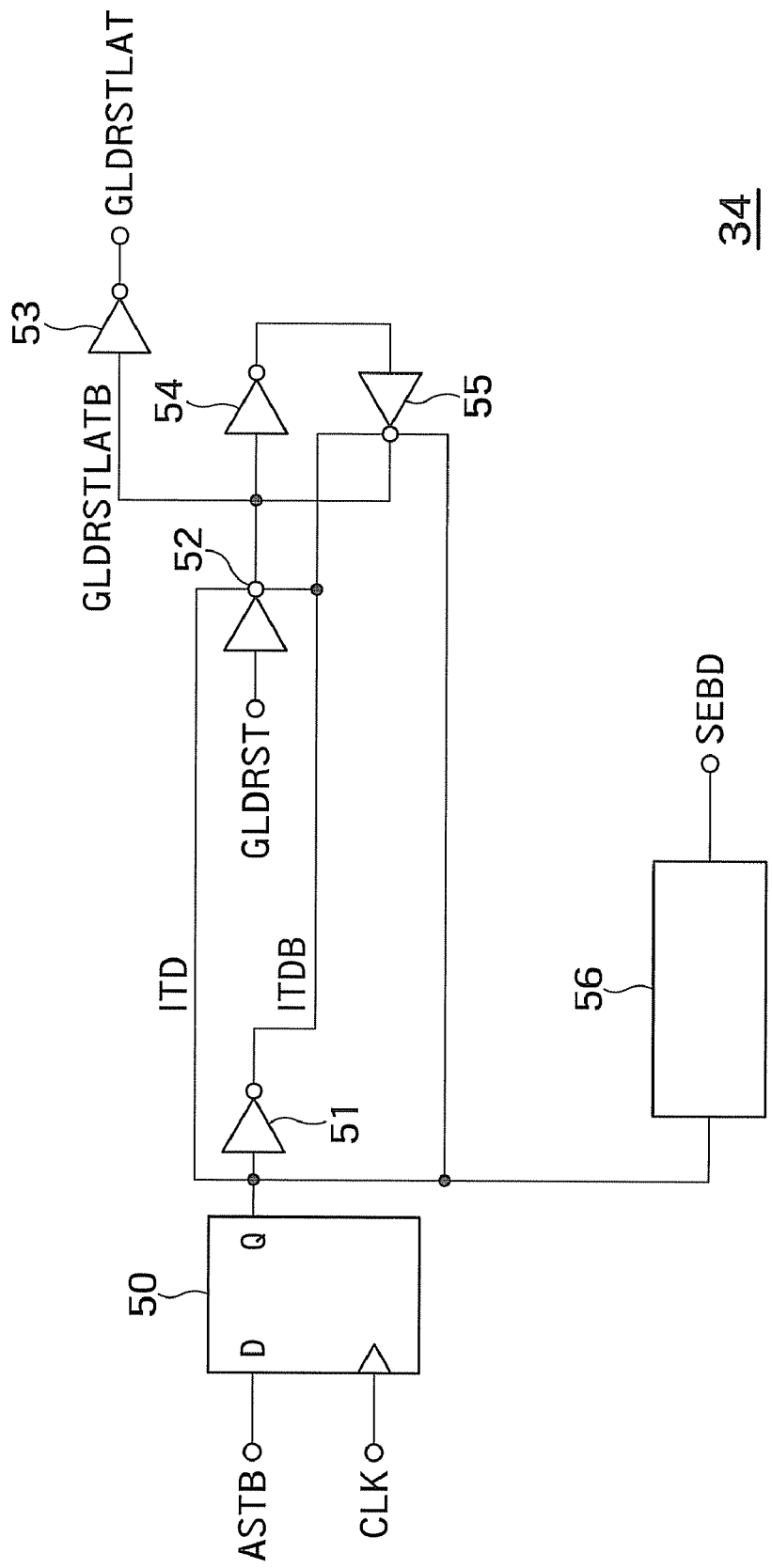
FIG. 5 is a circuit diagram of a GLDRSTLAT signal generation circuit according to the first embodiment of the present invention.

FIG. 5 is a circuit diagram of the GLDRSTLAT signal generation circuit. As shown in the figure, an input terminal of a flip-flop 50 is supplied with an ASTB signal and a clock input terminal is supplied with a clock signal CLK. From an output terminal of the flip-flop 50, an ITD signal is output and applied to an input terminal of the inverter 51, one control terminal of a clocked inverter 52, the other control terminal of a clocked inverter 55, and an SEBD signal generation circuit 56. From an output terminal of the inverter 51, an ITDB signal is output and applied to the other control terminal of the clocked inverter 52 and one control terminal of the clocked inverter 55. An output terminal of the clocked inverter 52 is connected to an input terminal of an inverter 53, an input terminal of an inverter 54, and an output terminal of the clocked inverter 55. An output terminal of the inverter 54 is connected to an input terminal of the clocked inverter 55. From an output terminal of the inverter 53, a GLDRSTLAT signal is provided. From the output terminal of the inverter 52, a GLDRSTLATB signal is provided. From the SEBD signal generation circuit 56, an SEBD signal (control signal that controls the sense amplifier) is provided.

Figure 6:
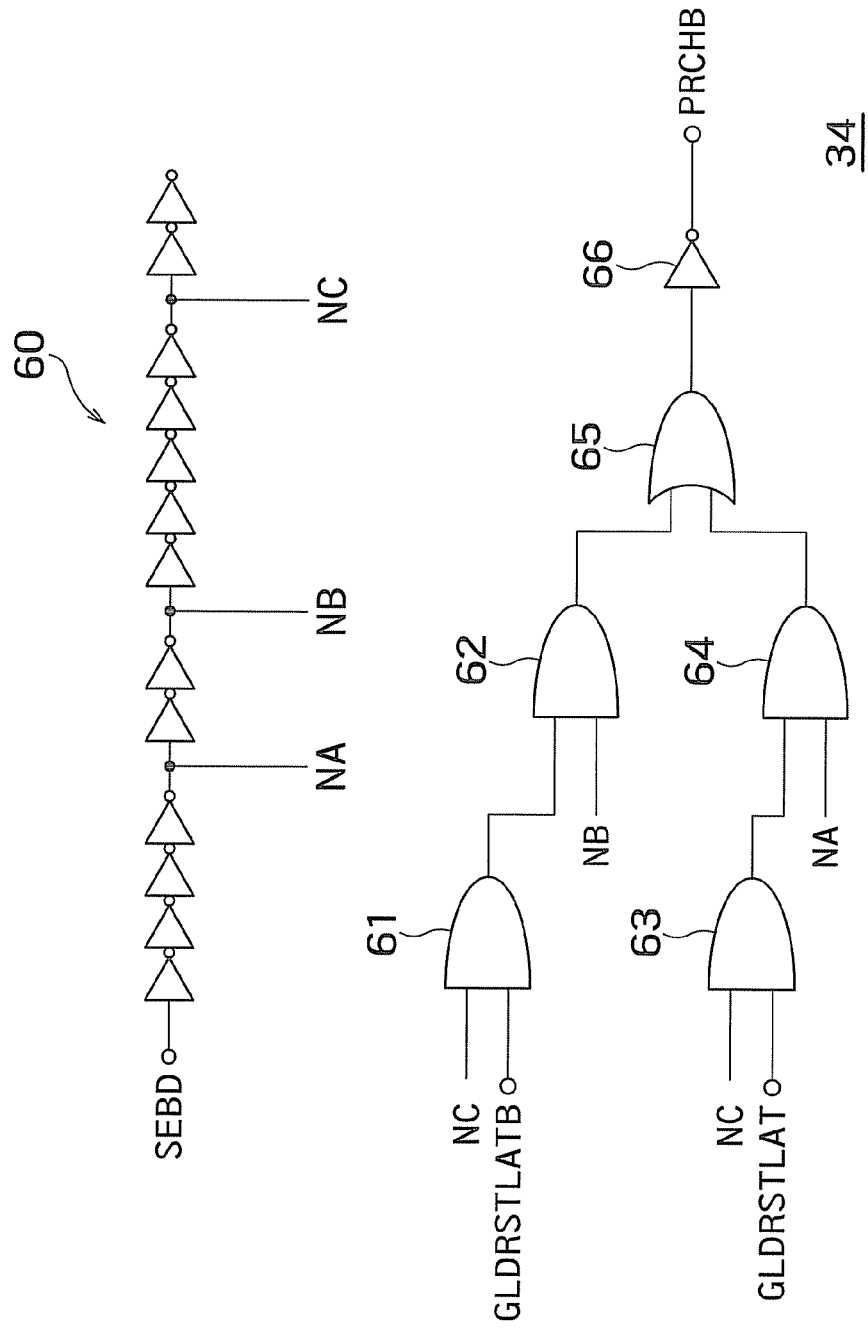
FIG. 6 is a circuit diagram of a PRCHB signal generation circuit according to the first embodiment of the present invention.

FIG. 6 is a circuit diagram of the PRCHB signal generation circuit. As shown in the figure, a delay circuit 60 includes a predetermined stages of inverters connected in series. The SEBD signal is supplied to the first-stage inverter. An NA signal (first delayed signal) is output from the fourth-stage inverter, an NB signal (first delayed signal) is output from the sixth-stage inverter, and an NC signal (second delayed signal) is output from the eleventh-stage inverter.

An AND circuit 61 is supplied with the GLDRSTLATB signal, which goes to a higher level at the time of interrupt reading, and the NC signal, which determines a rising edge of the PRCHB signal.

An AND circuit 62 is supplied with an output signal of the AND circuit 61 and the NB signal, and the NB signal determines a falling edge of the PRCHB signal.

An AND circuit 63 is supplied with the GLDRSTLAT signal, which goes to the higher level at the time of uninterrupted reading, and the NC signal, which determines the rising edge of the PRCHB signal.

An AND circuit 64 is supplied with an output signal of the AND circuit 63 and the NA signal, and NA signal determines the falling edge of the PRCHB signal.

An output signal of the AND circuit 62 and an output signal of the AND circuit 64 are supplied to an OR circuit 65. An output signal of the OR circuit 65 is supplied to an inverter 66, and the inverter 66 outputs the PRCHB signal.

It is to be noted that one example has been given above in which the common NC signal is used as a signal that determines the rising edge of the PRCHB signal. However, the four signals that determine the rising edge and the falling edge may have timings different from each other.

Figure 7:
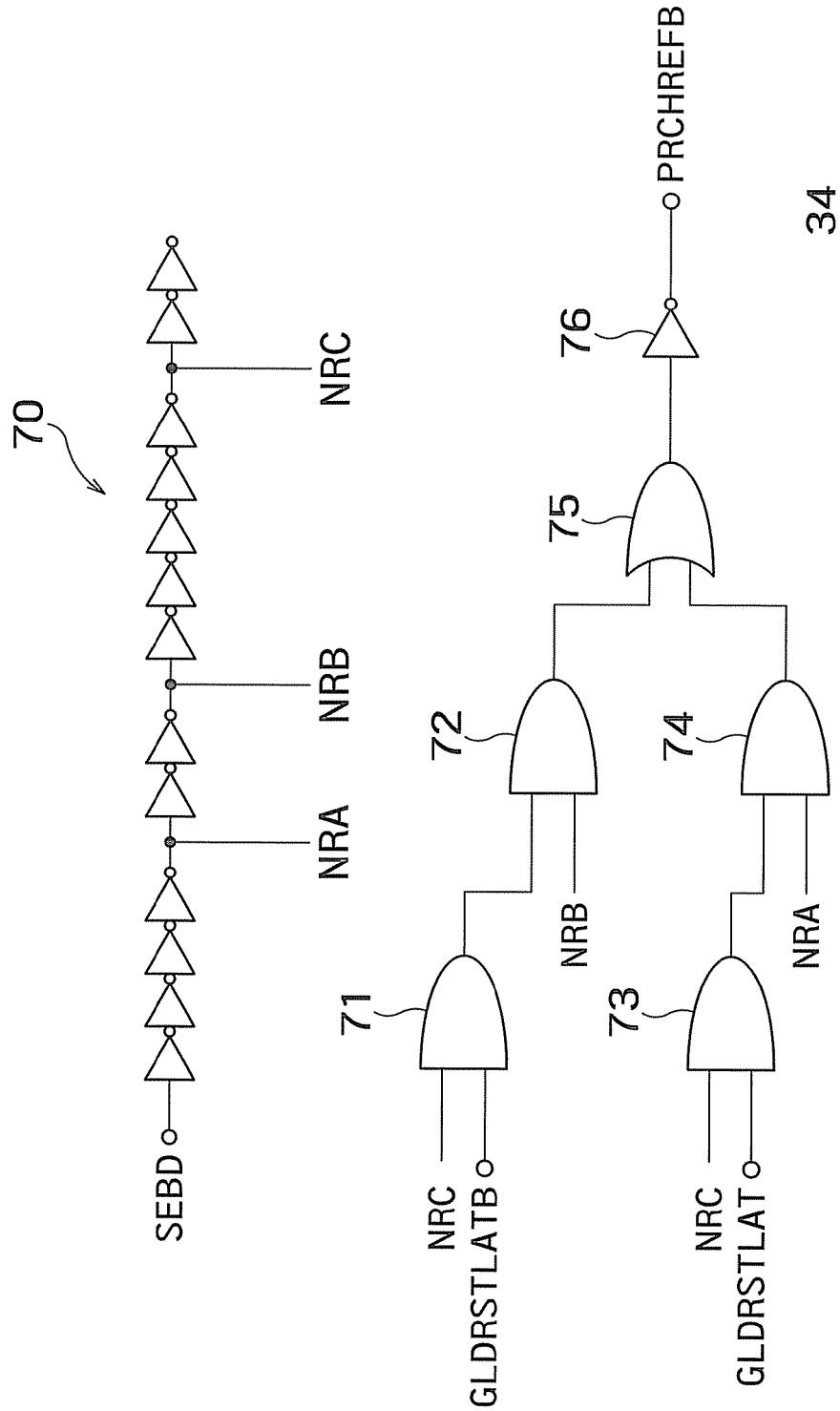
FIG. 7 is a circuit diagram of a PRCHREFB signal generation circuit according to the first embodiment of the present invention.

FIG. 7 is a circuit diagram of a PRCHREFB signal generation circuit. Since this circuit has the same constitution as FIG. 6, identical reference numerals are given to identical components in them, and repetitive description on the identical components will be omitted.

Although FIGS. 6 and 7 have shown one example in which the different delay circuits 60 and 70 are used to generate the different signals of PRCHB and PRCHREFB so that timings might be set for the NA signal etc. arbitrarily, a common delay circuit may be used instead.

It is to be noted that the sense amplifier 32, the pre-charge circuit 33, and the pre-charge control circuit 34 of FIG. 3 each include a plurality of sets of the circuits in FIGS. 4 to 7 described above.

Next, a description will be given of operations of the circuits in FIGS. 4 to 7 for each of uninterrupted reading and interrupt reading. Uninterrupted reading refers to normal reading. Interrupt reading refers to the operation that reading is stopped before being completed so that the next reading may be started.

[Uninterrupted Reading]

Figure 8:
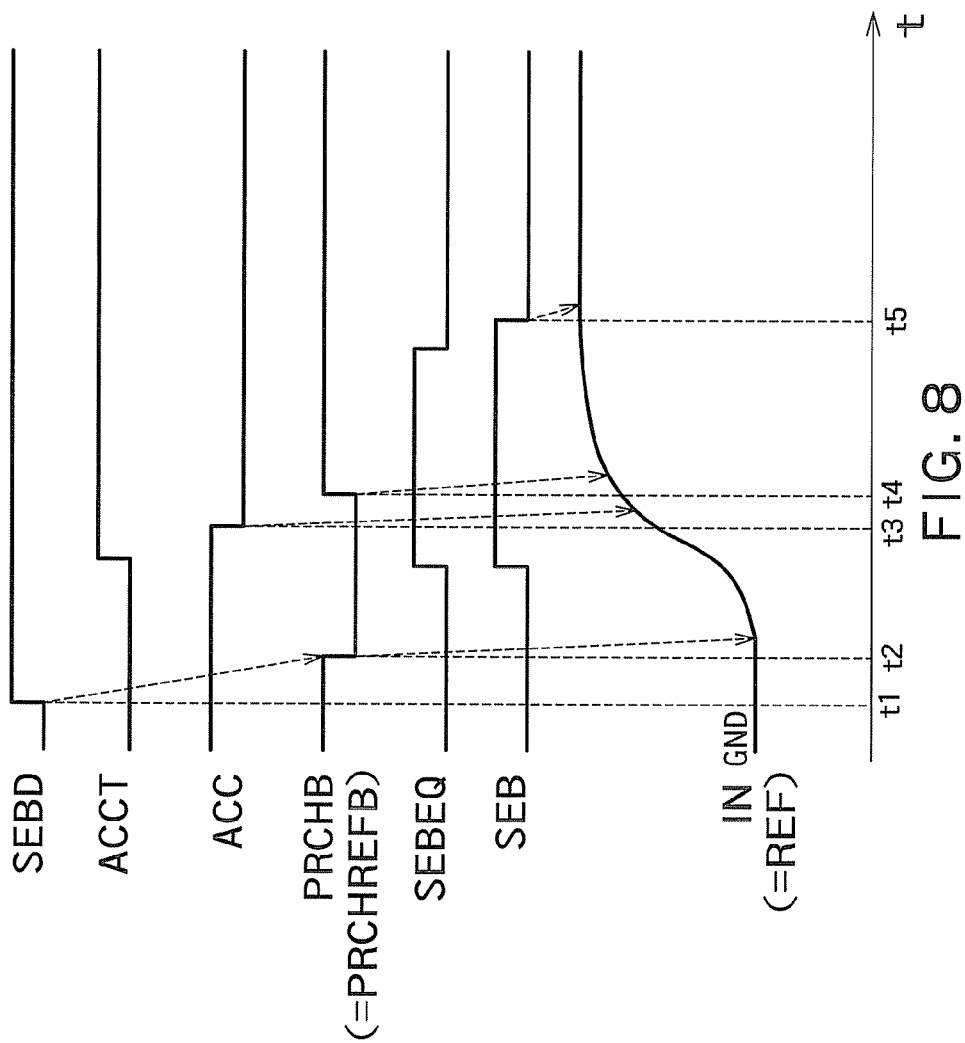
FIG. 8 is a timing chart of pre-charge and sense operations of the circuit of FIG. 4 at the time of uninterrupted reading according to the first embodiment of the present invention.

FIG. 8 is a timing chart of pre-charge and sense operations of the circuit of FIG. 4 at the time of uninterrupted reading. The pre-charge operations are performed in three stages.

First, in the first stage, if the SEBD signal rises (time t1), the PRCHB and PRCHREFB signals fall (time t2). This causes the input line IN to be pre-charged quickly by a current applied by the transistor Q13 (first pre-charge). On the other hand, the reference line REF is pre-charged quickly by a current applied by the transistor Q14 (second pre-charge). At this point in time, an ACCT signal is at a lower level, so that the transistors Q11 and Q12 are in an off-state. Generation of those SEBD, PRCHB, and PRCHREFB signals will be described below.

Further, in the second stage, the ACCT, SEBEQ, and SEB signals rise and then an ACC signal falls (time t3). This causes a current applied by the transistor Q1 to flow through the transistors Q11 and Q12 to the sides of the input line IN and reference line REF, so that those lines IN and REF are pre-charged also from the body side of the sense amplifier 32 (third pre-charge). Those ACCT, SEBEQ, SEB, and ACC signals are generated by delaying the SEBD signal respectively.

Next, in the third stage, the PRCHB and PRCHREFB signals rise, to limit the path for pre-charge to a current source (transistor Q1) in the body side of the sense amplifier 32 (time t4).

Then, if the SEBEQ signal falls and, subsequently, the SEB signal falls (time t5), the pre-charging ends, to permit the sense amplifier 32 to perform sensing.

In this process, the voltage of the SEB signal may be lowered stepwise so as to secure a current sense period of time which is necessary and sufficient to prevent the sense amplifier 32 from malfunctioning.

If the sensing ends, the SEB signal rises. This causes the input line IN and the reference line REF to be discharged through the path of transistors Q3 and Q4 and the path of transistors Q6 and Q7, thus recovering to their respective initial-state potentials (not shown).

In such a manner, according to this circuit, a pre-charge time can be reduced by quick pre-charging in the first stage.

Next, a description will be given of the generation of those control signals (SEBD, PRCHB, and PRCHREFB signals) with reference to FIGS. 9 and 10.

Figure 9:
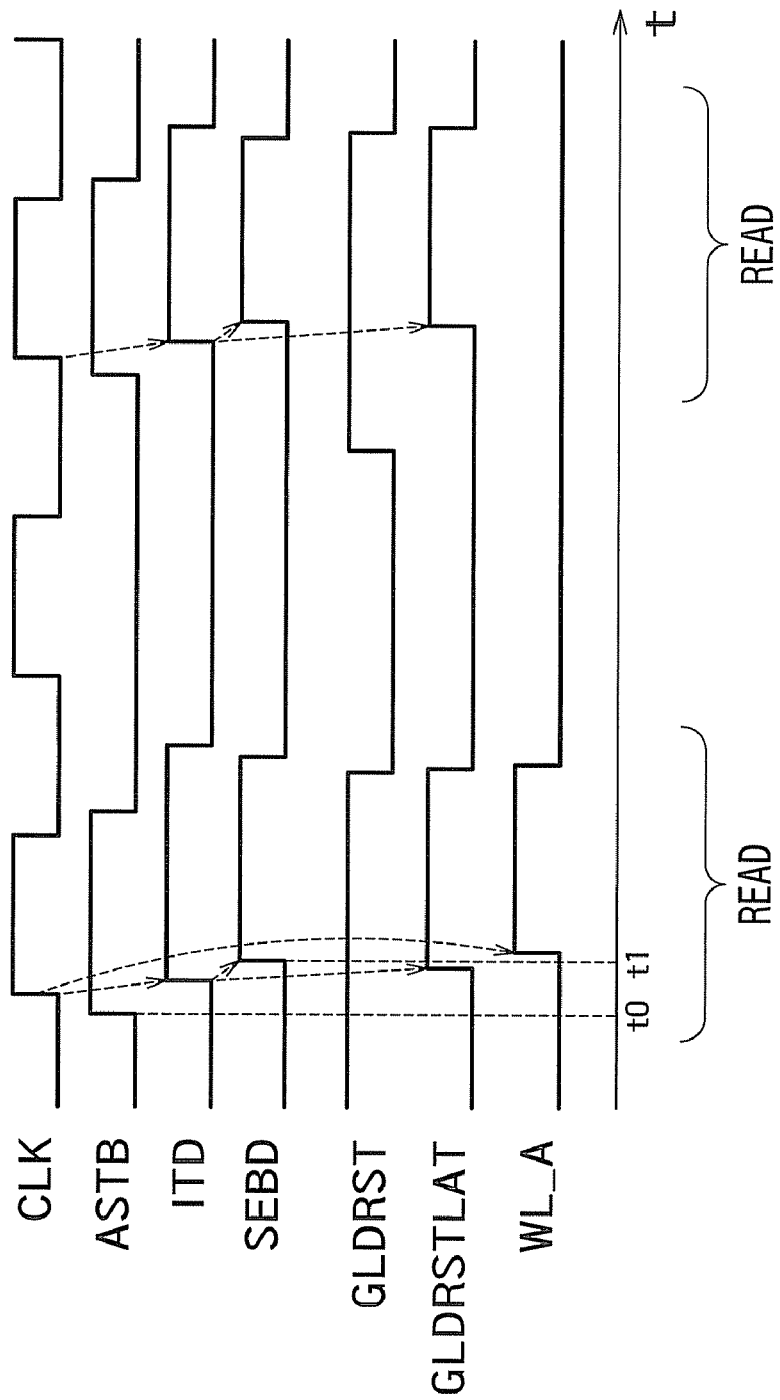
FIG. 9 is a timing chart of control signals at the time of uninterrupted reading according to the first embodiment of the present invention.

FIG. 9 is a timing chart of the control signals at the time of uninterrupted reading. The figure shows a process in which reading is performed twice in the circuit of FIG. 5.

Each time the clock signal CLK rises twice, the ASTB signal and a reading address (not shown) are supplied to perform reading. Hereinafter, a description will be given of a process in which one reading is performed, starting from time t0.

First, at time t0, the ASTB signal rises. Then, at the next rising of the clock signal CLK, the ASTB signal is taken in by the flip-flop 50 so that the ITD signal may rise. In this case, the clocked inverters 52 and 54 and the inverter 53 cause the higher level of the GLDRST signal to be latched at the rising of the ITD signal, thereby raising the GLDRSTLAT signal. It is to be noted that the GLDRST signal prescribes a timing to reset an output line etc. of the sense amplifier 32 after data is output from it, and the GLDRST signal has a constant transition timing irrespective of being interrupted or uninterrupted.

Concurrently with this operation, in a word line signal generation circuit (not shown), an address (not shown) is taken in with the clock signal CLK and decoded, so that a word line signal WL_A rises which corresponds to that address. The word line signal WL_A is supplied to the memory cells.

Further, the ITD signal is delayed by the SEBD signal generation circuit 56, to generate the SEBD signal, which rises at time t1 described above with reference to FIG. 8. The SEBD signal is supplied to the circuits of FIGS. 6 and 7, to generate the aforesaid PRCHB and PRCHREFB signals.

Figure 10:
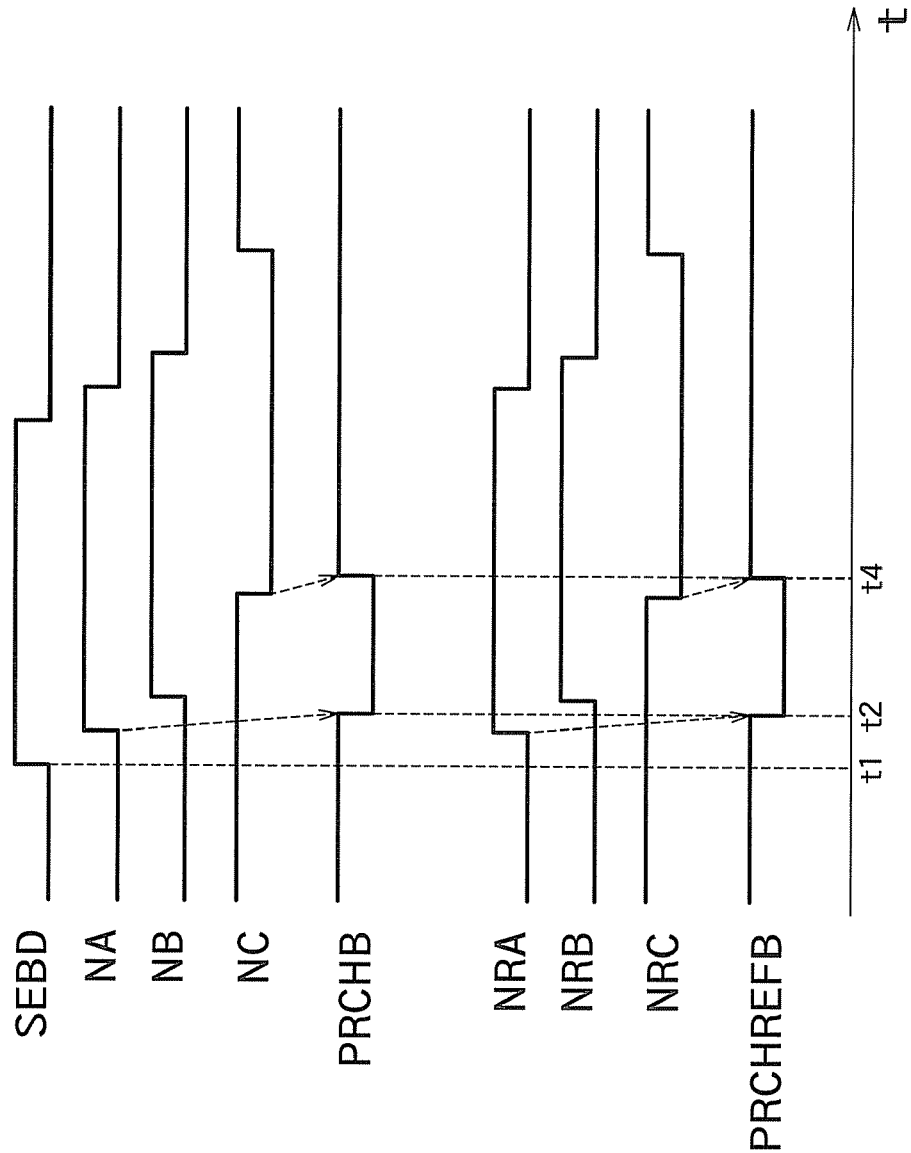
FIG. 10 is a timing chart of the PRCHB and PRCHREFB signals at the time of uninterrupted reading according to the first embodiment of the present invention.

FIG. 10 is a timing chart of the PRCHB and PRCHREFB signals at the time of uninterrupted reading. The figure corresponds to a process in which one reading is performed, starting from time t0, in FIG. 9.

The circuits of FIGS. 6 and 7 are used to generate the NA, NB, NC, NRA, NRB, and NRC signals, which are obtained by delaying the SEBD signal respectively.

As described above, during uninterrupted reading, the GLDRSTLAT signal is at the higher level and the GLDRSTLATB signal is at the lower level. Accordingly, in the circuits of FIGS. 6 and 7, the PRCHB and PRCHREFB signals are determined by the signals supplied to the AND circuits 63 and 64 and the AND circuits 73 and 74. That is, the PRCHB signal falls on the rising of the NA signal and rises on the falling of the NC signal. The PRCHREFB signal falls on the rising of the NRA signal and rises on the falling of the NRC signal. In this case, the NA signal and the NRA signal have the same transition timing and the NC signal and the NRC signal have the same transition timing. Therefore, based on the SEBD signal, the PRCHB and PRCHREFB signals are generated, which fall at time t2 and rise at time t4. In such a manner, the PRCHB and PRCHREFB signals are generated based on the SEBD and GLDRSTLATB signals.

[Interrupt Reading]

Interrupt reading starts before execution of a series of processing steps of reading operation ends, the series of processing steps of reading operation beginning before interruption. Therefore, in the reading operation before interruption, a predetermined bit line and a predetermined reference bit line are once pre-charged and then start to undergo interrupt reading in a condition where they are at a high potential without being discharged.

It is to be noted that when the same block in the memory cell array is being read, the reference line REF of the sense amplifier 32 remains connected to the same reference bit line. On the other hand, the input line IN of the sense amplifier 32 is connected to a bit line that corresponds to a specified address, via a column selector. That is, the input line IN is connected to the bit line that was connected to the input line IN during reading before interruption, in some cases, and to the bit line different from that bit line, in the other cases. If being connected to the same bit line, the input line IN is in a high-potential state. If being connected to different bit lines, the input line IN is in a low-potential state. Here, a description will be given of the case where the input line IN and the reference line REF are in the high-potential state.

If the input line IN and the reference line REF are pre-charged by the transistors Q13 and Q14, for almost the same period of time as that at the time of the aforesaid uninterrupted reading, in a condition where those lines are set to the high potential beforehand, those lines are overcharged and their potentials rise excessively. This causes the operating point of the sense amplifier 32 to change, thus preventing it from performing sensing stably. To solve this problem, as described below, the time in which the input line IN and the reference line REF are pre-charged is shortened by delaying the rising of the PRCHB and PRCHREFB signals more than that in the case of uninterrupted reading.

Figure 11:
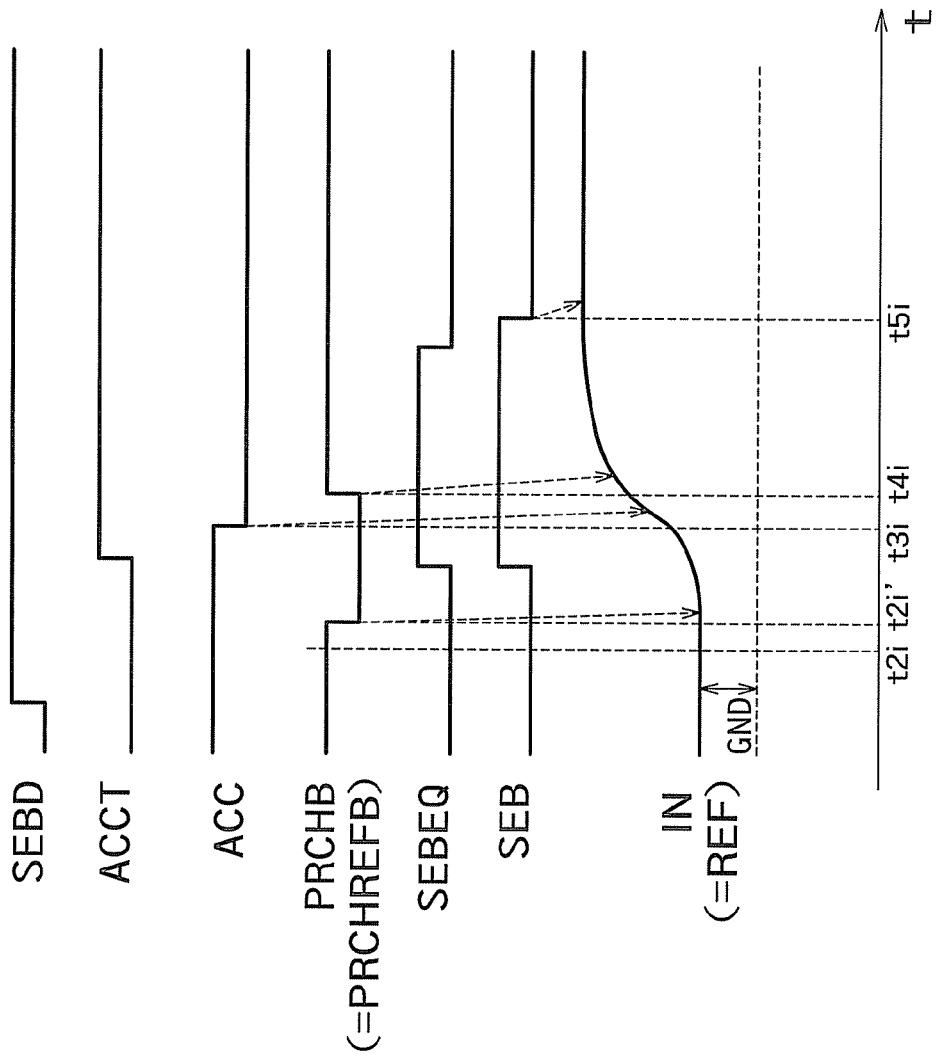
FIG. 11 is a timing chart of pre-charge and sense operations of the circuit of FIG. 4 at the time of interrupt reading according to the first embodiment of the present invention.

FIG. 11 is a timing chart of pre-charge and sense operations of the circuit of FIG. 4 at the time of interrupt reading. Here, a description will be given of operations different from those at the time of uninterrupted reading.

At time t1i when the SEBD signal rises, as described above, the input line IN and the reference line REF are already at a higher potential than that at the time of uninterrupted reading. Next, the PRCHB signal and the PRCHREFB signal fall at time t2i', which timing is later than timing (time t2i) at the time of uninterrupted reading. Then, they rise at time t4i, which timing is the same as that at the time of uninterrupted reading. This causes the time period, when the transistors Q13 and Q14 are turned on and quickly pre-charge the lines, to become shorter than that at the time of uninterrupted reading. Therefore, the input line IN and the reference line REF are quickly charged to almost the same potential as that at the time of uninterrupted reading without being overcharged. Their subsequent operations are the same as those in FIG. 8.

Next, a description will be given of generation of the aforesaid control signals (SEBD, PRCHB, and PRCHREFB signals) with reference to FIGS. 12 and 13.

Figure 12:
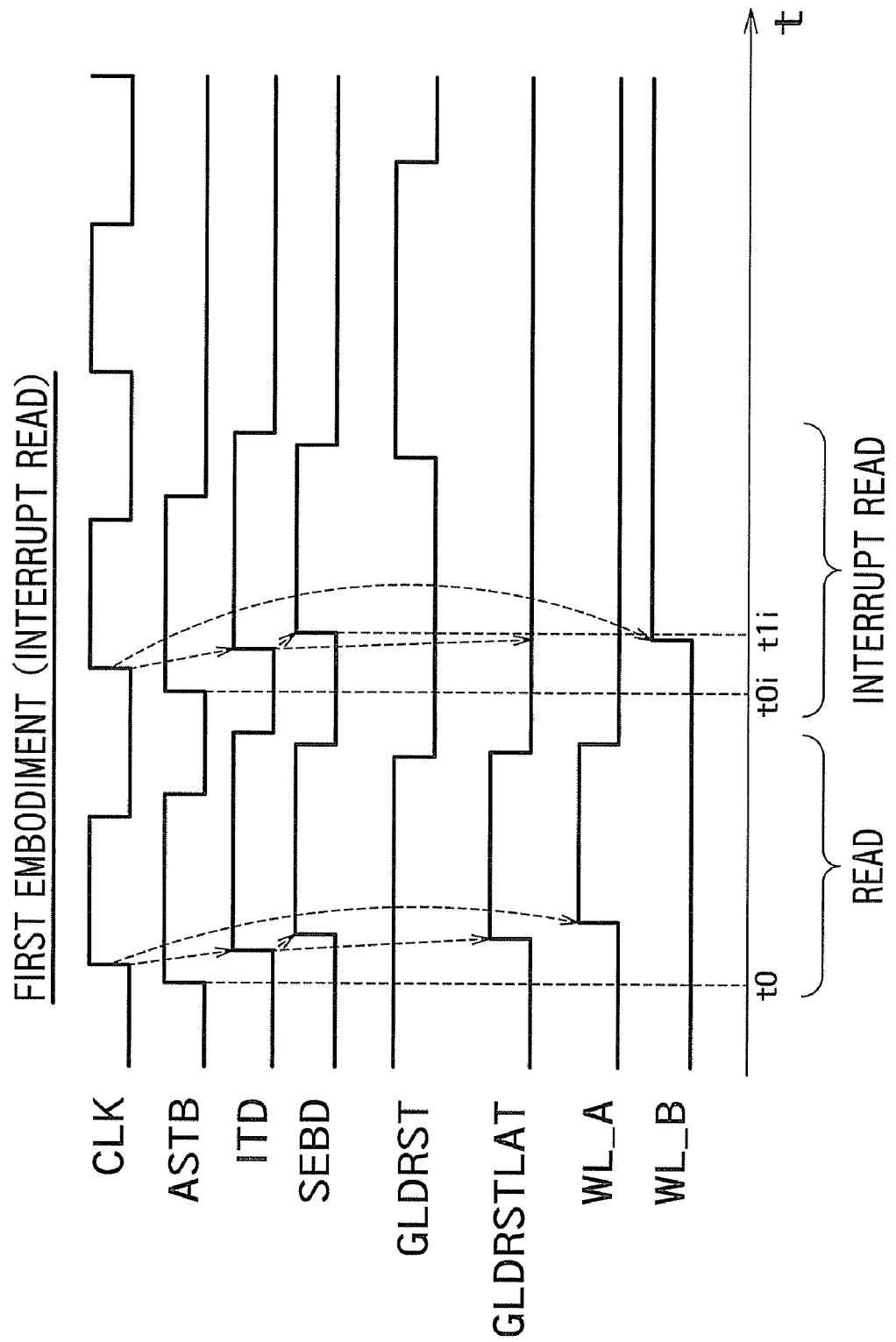
FIG. 12 is a timing chart of the control signals at the time of interrupt reading according to the first embodiment of the present invention.

FIG. 12 is a timing chart of the control signals at the time of interrupt reading. As shown in the figure, the ASTB signal rises at time t0 and, subsequently, the clock signal CLK rises to start normal reading; then, at time t0i before the clock signal CLK rises next time, the ASTB signal rises again to start interrupt reading. This causes the ITD signal to rise as described above. At this point in time, the GLDRST signal at the lower level is latched by the clocked inverters 52 and 54 and the inverter 53 at the rising of the ITD signal, so that the GLDRSTLAT signal holds the lower level. That is, by permitting the ASTB signal to rise one clock earlier than in the case of uninterrupted reading, the GLDRSTLAT signal goes to the lower level. Further, after the word line signal WL_A falls, another word line signal WL_B for interrupt reading rises. Also, at time t1i, the SEBD signal rises as described above.

Figure 13:
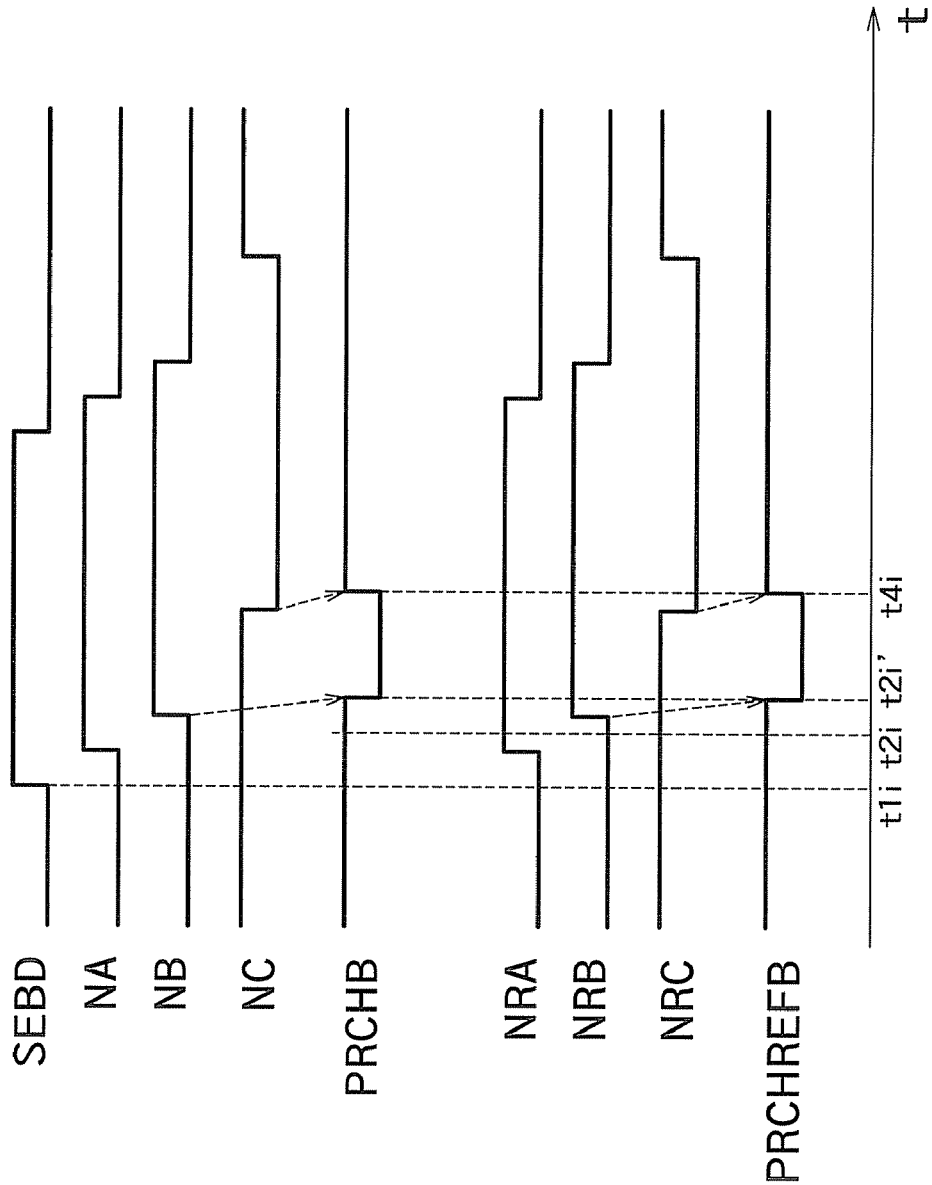
FIG. 13 is a timing chart of the PRCHB and PRCHREFB signals at the time of interrupt reading according to the first embodiment of the present invention.

FIG. 13 is a timing chart of the PRCHB and PRCHREFB signals at the time of interrupt reading. The figure corresponds to interrupt reading starting from time t0i in FIG. 12.

As described above, during interrupt reading, the GLDRSTLATB signal is at the higher level and the GLDRSTLAT signal is at the lower level. Therefore, in the circuits of FIGS. 6 and 7, the PRCHB and PRCHREFB signals are determined by the signals supplied to the AND circuits 61 and 62 and the AND circuits 71 and 72. That is, the PRCHB signal falls on the rising of the NB signal and rises on the falling of the NC signal. The PRCHREFB signal falls on the rising of the NRB signal and rises on the falling of the NRC signal. Therefore, the PRCHB and PRCHREFB signals that fall at time t2i' and rise at time t4i are generated.

Thus, the pre-charge control circuit 34 is arranged to delay the start of pre-charging the input line or the reference line whichever has a higher potential than a predetermined value by a predetermined time at the time of interrupt reading, thereby shortening the pre-charge time.

It is to be noted that as shown in FIG. 13, at the time of interrupt reading, it is preferable that the PRCHB and PRCHREFB signals recover to the higher level at the same timing. In this case, as the NC and NRC signals which determine the rising edge, the same signal may be used.

As thus described, according to the present embodiment, the transistors Q13 and Q14 used only for pre-charging are equipped to each of the input line IN and the reference line REF, so that it is possible to enhance the current driving capability of the transistors Q13 and Q14 without changing the current driving capability of the transistor Q1. This enables quick pre-charging and permits the sense amplifier 32 to perform sensing stably. Further, the pre-charge timing can be set easily, so that in the case of interrupt reading, if the input line IN and the reference line REF are at the high potential, the start of pre-charging can be delayed to shorten the pre-charge time, thereby preventing those lines from being overcharged. Accordingly, the operating point of the sense amplifier 32 does not change so much, so that the sense amplifier 32 can perform sensing stably.

(Second Embodiment)

Next, a description will be given of the second embodiment with reference to FIGS. 14 to 16. The present embodiment is different from the first embodiment in that in the case of interrupt reading, the start of pre-charging by a transistor Q14 is delayed to shorten the pre-charge time.

Here, a description will be given of a case where there is a restriction that, in the case of interrupt reading, an input line IN must be connected to a bit line different from the one to which the input line IN was connected during the previous access. In this case, the input line IN is connected to the bit line different from the one to which the input line IN was connected during reading before interruption, so that its potential is lowered. On the other hand, a reference line REF is always connected to the same reference bit line, so that its potential is raised.

Figure 14:
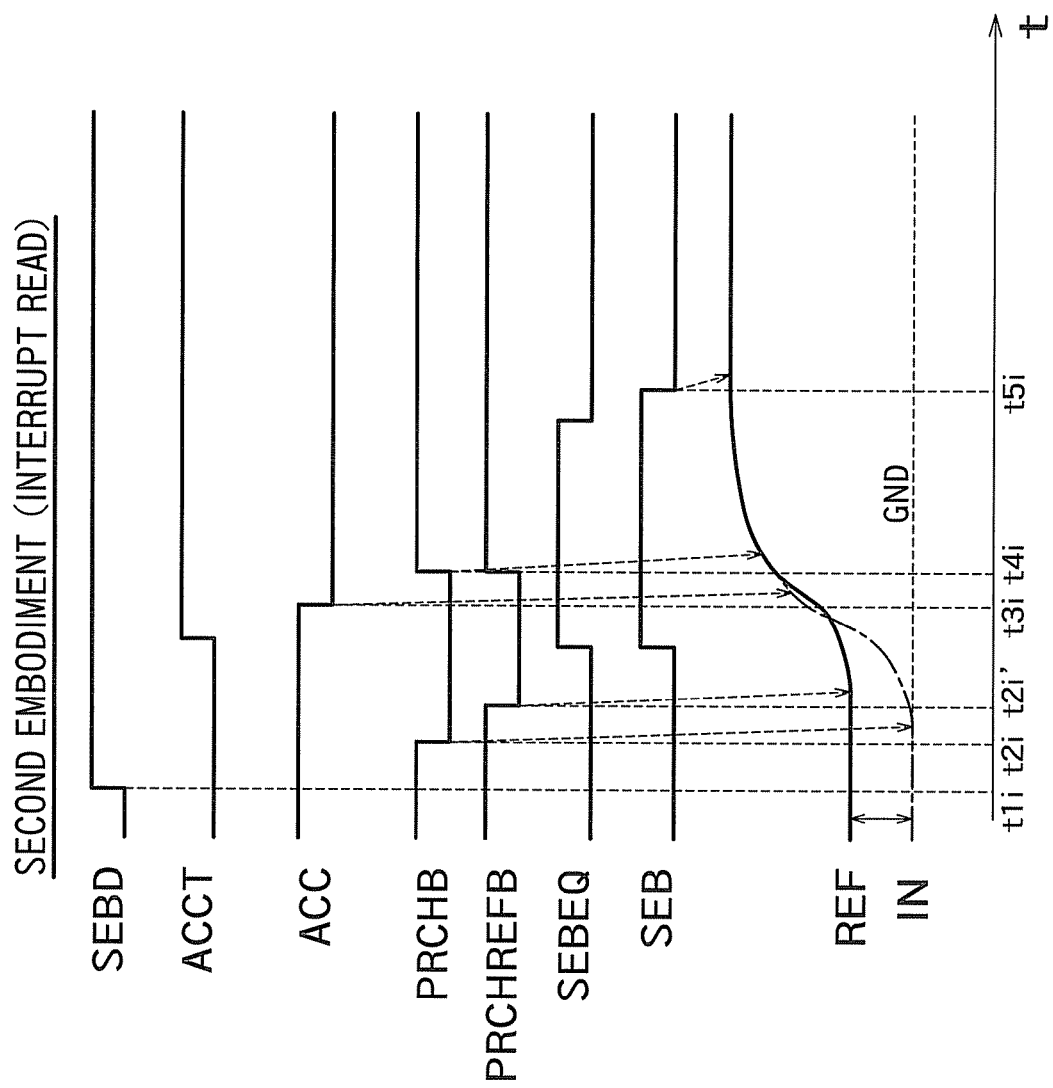
FIG. 14 is a timing chart of pre-charge operations at the time of interrupt reading according to a second embodiment of the present invention.

FIG. 14 is a timing chart of pre-charge operations at the time of interrupt reading. A description will be given of operations different from those of the first embodiment. As shown in the figure, a timing (time t2i') when a PRCHREFB signal shifts to a lower level to start pre-charging of the reference line REF, is set in such a manner that it may occur later than a timing (time t2i) when pre-charging of the input line IN starts. The timing to start pre-charging of the input line IN is constant irrespective of whether reading is interrupted or not. This enables quickly pre-charging the input line IN in a low potential state and also quickly pre-charging the reference line REF in a high potential state without overcharging it.

Figure 15:
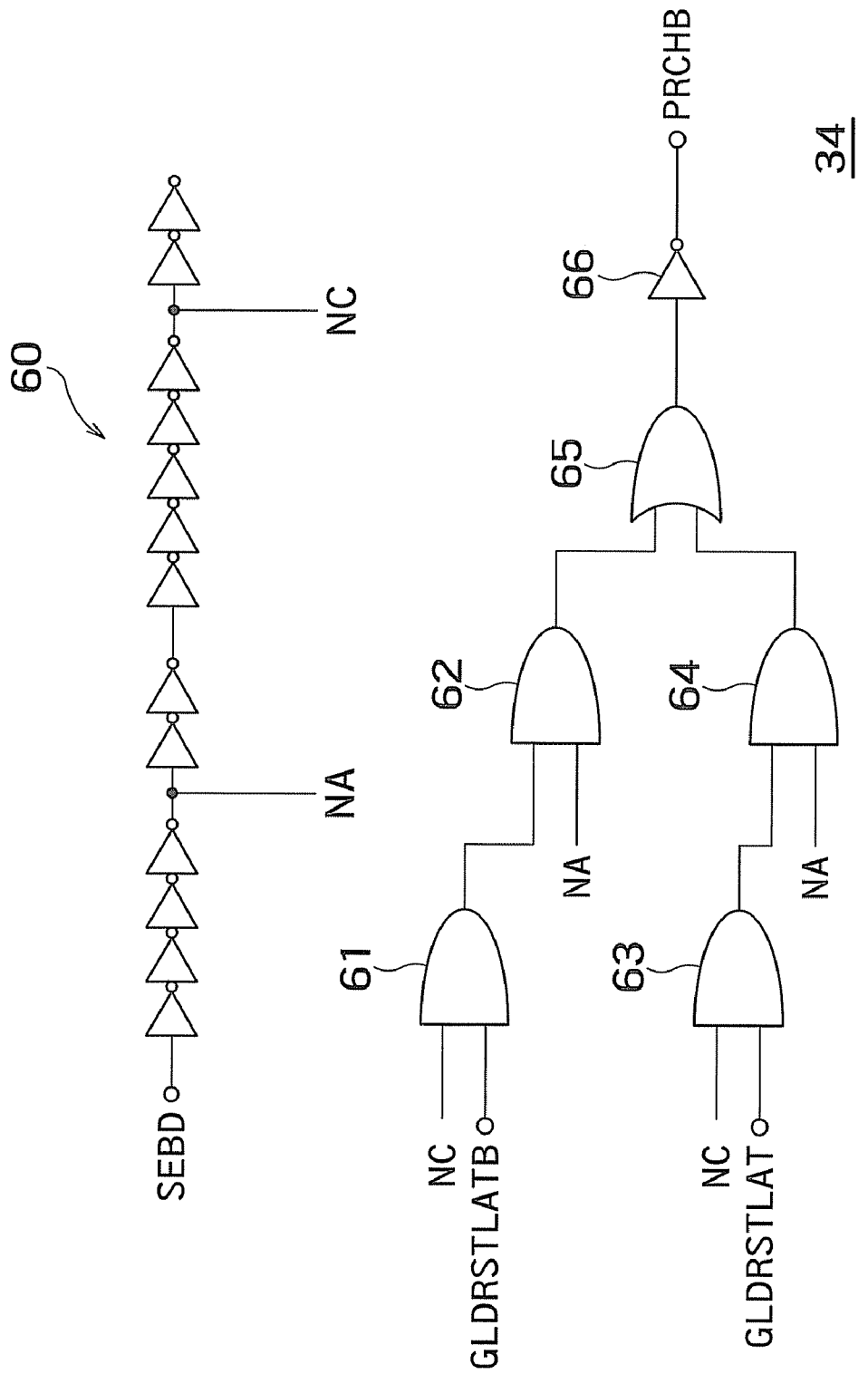
FIG. 15 is a circuit diagram of a PRCHB signal generation circuit according to the second embodiment of the present invention.

FIG. 15 is a circuit diagram of a PRCHB signal generation circuit. This circuit is different from the circuit in FIG. 6 of the first embodiment in that an NA signal is supplied to an AND circuit 62.

The PRCHREFB signal is generated by the same circuit as that of the first embodiment in FIG. 7.

Figure 16:
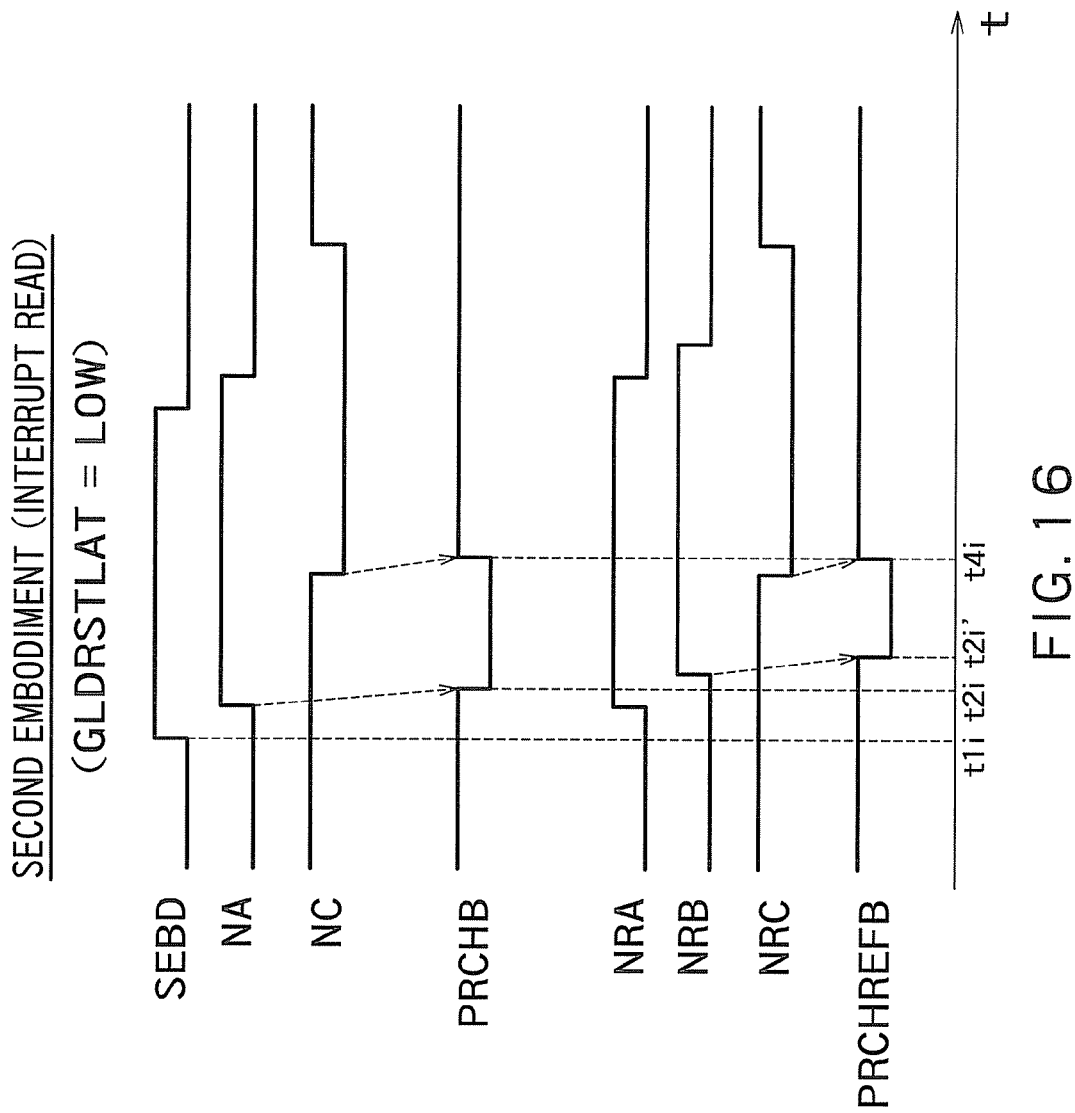
FIG. 16 is a timing chart of the PRCHB and PRCHREFB signals at the time of interrupt reading according to the second embodiment of the present invention.

FIG. 16 is a timing chart of the PRCHB and PRCHREFB signals at the time of interrupt reading. As can be seen from FIGS. 15 and 16, the PRCHB signal shifts at the same timings irrespective of the logics of a GLDRSTLAT signal.

That is, a pre-charge control circuit 34 is arranged to delay the start of pre-charging the input line or the reference line whichever has a higher potential than a predetermined value by a predetermined time at the time of interrupt reading, thereby shortening the pre-charge time.

As thus described, according to the present embodiment, in the case of interrupt reading, if only the reference line REF has a high potential, the start of pre-charging by the transistor Q14 is delayed to shorten the pre-charge time, thereby preventing the reference line REF from being overcharged. This permits a sense amplifier 32 to perform sensing stably.

Further, by setting delay times in delay circuits 60 and 70, it is possible to arbitrarily set the rising timing and the falling timing of each of the PRCHB and PRCHREFB signals respectively. This enables arbitrarily setting timings to start and end pre-charging of the input line IN and the reference line REF, thus setting an optimal pre-charge time according to reading.

Although the above embodiments have been described with reference to one example in which the present invention is applied, to the case of preventing the input line IN or the reference line REF from being overcharged at the time of interrupt reading, the present invention can be applied also to a case waiting for switching of the potential of word lines as described below.

Here, a description will be given of one example in which pre-charging takes place not sufficiently quickly and the level of importance in the problem of overcharging is less than that in the problem of a time of switching the potential of the word lines.

If the word line takes a long time to fall in potential because it has a large capacitance, it is necessary to pre-charge the input line IN after the potential of the word line is switched, at the time of interrupt reading. The reason is there is a possibility that if pre-charging starts when the potential of a word line, selected before interrupt reading, does not sufficiently fall yet, the pre-charging may not normally be carried out. To solve this problem, the transition timing of the PRCHB signal is delayed more than that in the case of uninterrupted reading, thereby retarding the start of pre-charging.

On the other hand, if reference cells which are all non-selected (all word lines are at the lower level) are connected to the reference line REF, pre-charging can be performed irrespective of the switching timing of the word line. Therefore, the transition timing of the PRCHREFB signal is set in the same way as in the case of uninterrupted reading.

That is, in the case of interrupt reading, the start of pre-charging by a pre-charge circuit 33 is delayed by a predetermined time for the memory cells or the reference cells whichever are connected with the word line having a potential higher than a predetermined value.

Further, the present invention can be applied not only to the case of interrupt reading but also to a case where there is a possibility that the input line IN or the reference line REF may be overcharged during pre-charging because the line is at a high potential in the case of normal reading. Such a case may occur, for example, if the cycle time is shortened during reading or the supply voltage has fluctuated. In this case, the start of pre-charging the input line IN or the reference line REF whichever has a potential higher than the predetermined value can be delayed by the predetermined time to shorten the pre-charge time, thereby preventing the line from being overcharged.

Although the embodiments of the present invention have been described in detail, the specific constitution is not limited to them and can be realized in various modifications without departing from the gist of the present invention.

For example, the PMOS transistors Q13 and Q14 may be changed to an NMOS transistor.

The invention claimed is:

1. A semiconductor integrated circuit comprising:
a current difference sense type of a sense amplifier comprising:
an input line connected to memory cells as a target to be read,
a reference line connected to reference cells, and
a first pre-charge circuit configured to pre-charge the input line and the reference line;
a second pre-charge circuit configured to perform pre-charging of the input line and pre-charging of the reference line; and
a control circuit configured to control the second pre-charge circuit so that the second pre-charge circuit performs both the pre-charging of the input line and the pre-charging of the reference line independently of each other, and starts both the pre-charging of the input line and the pre-charging of the reference line earlier than pre-charging by the first pre-charge circuit.

2. The semiconductor integrated circuit according to claim 1, wherein
the sense amplifier further comprises a differential amplifier configured to sense a current difference between the input line and the reference line, and
the first pre-charge circuit constitutes a current source in the differential amplifier.

3. The semiconductor integrated circuit according to claim 2, wherein the first pre-charge circuit comprises a first MOS transistor comprising one terminal connected to a power supply, the other terminal connected to the differential amplifier, and a control terminal controlled by the control circuit.

4. The semiconductor integrated circuit according to claim 1, wherein the control circuit controls the second pre-charge circuit by using a pre-charge control signal, the pre-charge control signal is generated based on a control signal controlling the sense amplifier.

5. The semiconductor integrated circuit according to claim 4, wherein the control circuit comprises:
   a delay circuit configured to delay the control signal to generate a first delayed signal and a second delayed signal, the second delayed signal being obtained by inverting the first delayed signal and delaying it further; and
   a logic circuit configured to output a logical product of the first delayed signal and the second delayed signal, as the pre-charge control signal.

6. The semiconductor integrated circuit according to claim 1, wherein the control circuit is configured to delay start of the pre-charging, by the second pre-charge circuit, of a certain line by a predetermined time at time of reading, the certain line being the input line or the reference line whichever has a higher potential than a predetermined value, thereby shortening a pre-charge time.

7. The semiconductor integrated circuit according to claim 6, wherein the time of reading refers to the time of interrupt reading.

8. The semiconductor integrated circuit according to claim 1, wherein the control circuit is configured to delay start of the pre-charging, by the second pre-charge circuit, of certain cells by a predetermined time at time of interrupt reading, the certain cells being the memory cells or the reference cells whichever are connected with a specific word line, the potential of the specific word line being higher than a predetermined value.

9. The semiconductor integrated circuit according to claim 1, wherein the control circuit controls the first pre-charge circuit, the second pre-charge circuit, and the sense amplifier so that:
   the pre-charging by the first pre-charge circuit ends after the pre-charging by the second pre-charge circuit ends; and sensing by the sense amplifier is performed after the pre-charging by the first pre-charge circuit ends.

10. The semiconductor integrated circuit according to claim 1, wherein the second pre-charge circuit comprises:
    a second MOS transistor comprising one terminal connected to a power supply, the other terminal connected to the input line, and a control terminal controlled by the control circuit; and
    a third MOS transistor comprising one terminal connected to the power supply, the other terminal connected to the reference line, and a control terminal controlled by the control circuit.

11. The semiconductor integrated circuit according to claim 10, wherein the second MOS transistor and the third MOS transistor are a P type MOS transistor.

12. The semiconductor integrated circuit according to claim 1, wherein the second pre-charge circuit has higher current driving capability than the first pre-charge circuit.

13. A method for controlling a semiconductor integrated circuit comprising:
    a differential current sense amplifier comprising:
    an input line connected to memory cells as a target to be read, a reference line connected to reference cells, and a first pre-charge circuit configured to pre-charge the input line and the reference line; and
    a second pre-charge circuit configured to perform pre-charging of the input line and pre-charging of the reference line, the method comprising:
    performing both the pre-charging of the input line and the pre-charging of the reference line, by the second pre-charge circuit, independently of each other; and
    starting both the pre-charging of the input line and the pre-charging of the reference line, by the second pre-charge circuit, earlier than pre-charging by the first pre-charge circuit.

14. The method according to claim 13, wherein a pre-charge control signal is used to control the second pre-charge circuit, the pre-charge control signal is generated based on a control signal controlling the sense amplifier.

15. The method according to claim 13, wherein start of the pre-charging, by the second pre-charge circuit, of a certain line is delayed by a predetermined time at time of reading, the certain line being the input line or the reference line whichever has a higher potential than a predetermined value, thereby shortening a pre-charge time.

16. The method according to claim 15, wherein the time of reading refers to the time of interrupt reading.

17. The method according to claim 13, wherein start of the pre-charging, by the second pre-charge circuit, of certain cells is delayed by a predetermined time at time of interrupt reading, the certain cells being the memory cells or the reference cells whichever are connected with a specific word line, the potential of the specific word line being higher than the predetermined value.

18. The method according to claim 13, wherein
    the pre-charging by the first pre-charge circuit ends after the pre-charging by the second pre-charge circuit ends, and
    sensing by the sense amplifier is performed after the pre-charging by the first pre-charge circuit ends.

19. The method of claim 13, wherein as the second pre-charge circuit, a circuit having higher current driving capability than the first pre-charge circuit is used.

* * * * *